United States Patent [19]
Borodovsky

[11] Patent Number: 5,946,079
[45] Date of Patent: Aug. 31, 1999

[54] PHOTOLITHOGRAPHY METHOD USING COHERENCE DISTANCE CONTROL

[75] Inventor: Yan Borodovsky, Portland, Oreg.

[73] Assignee: Intel Corporation, Santa Clara, Calif.

[21] Appl. No.: 08/962,138

[22] Filed: Oct. 31, 1997

Related U.S. Application Data

[62] Division of application No. 08/497,321, Jun. 30, 1995, Pat. No. 5,801,821.

[51] Int. Cl.[6] .............................. G03B 27/54; G03B 27/42
[52] U.S. Cl. ................................................. 355/67; 355/53
[58] Field of Search ..................................... 356/122, 399, 356/400, 401; 355/53, 67, 71, 77; 359/559, 618; 353/31, 101; 430/5, 14, 15, 22

[56] References Cited

U.S. PATENT DOCUMENTS

| | | | |
|---|---|---|---|
| 5,016,149 | 5/1991 | Tanaka et al. | 362/259 |
| 5,237,367 | 8/1993 | Kudo | 355/67 |
| 5,337,097 | 8/1994 | Suzuki et al. | 353/101 |
| 5,473,410 | 12/1995 | Nishi | 355/53 |
| 5,483,311 | 1/1996 | Sakakibara | 355/53 |
| 5,530,518 | 6/1996 | Ushida et al. | 355/53 |
| 5,594,526 | 1/1997 | Mori et al. | 355/67 |
| 5,597,667 | 1/1997 | Nakao | 430/5 |
| 5,703,675 | 12/1997 | Hirukawa et al. | 355/53 |

OTHER PUBLICATIONS

S. Wolf, Ph.D., "Silicon Processing", For the VLSI Era, vol. 2–Process Integration, pp. 66–67, 1990.

*Primary Examiner*—Safet Metjahic
*Assistant Examiner*—Hung Henry Nguyen
*Attorney, Agent, or Firm*—Blakely, Sokoloff, Taylor & Zafman

[57] ABSTRACT

A method for mapping coherence and a method and system for reducing varying coherence conditions of a stepper field exposure tool used in lithographic patterning. The present invention describes a method and system to reduce the effective light source of a stepper field exposure tool in order to decrease the variance of coherence conditions across a stepper field. The decrease in variance of coherence conditions across the stepper field corrects for a wide range of linewidth variation in lithographic patterning.

4 Claims, 8 Drawing Sheets

| | | |
|---|---|---|
| .72<br>.82 | .68<br>.68 | .80<br>.80 |
| | .76<br>.68 | .84<br>.72 |
| .83<br>.76 | .78<br>.68 | .88<br>.72 |
| | .84<br>.68 | .82<br>.72 |
| .84<br>.72 | .80<br>.82 | .88<br>.72 |

∽ 600

PHOTOLITHOGRAPHY METHOD USING COHERENCE DISTANCE CONTROL

This is a divisional of application application Ser. No. 08/497,321, filed Jun. 30, 1995 now U.S. Pat. No. 5,801,821.

BACKGROUND OF THE INVENTION

1. Field of the Invention

This invention relates to the field of semiconductor devices, and more specifically, to a process and system designed to improve linewidth control in photolithographic patterning.

2. Background Information

In the field of semiconductor devices the desire to achieve faster devices entails the fabrication of smaller and smaller devices. As device characteristics get smaller it becomes increasingly more important to control linewidth variation in lithographic patterning.

Linewidth variation, depending upon the severity, can cause a device to have poor performance or cause the device to fail altogether. For example, linewidth variation in the patterning of gate layers can cause the gate to be formed too large or too small. Larger gates slow down the semiconductor device such that the device has poor performance. Smaller gates are faster, however, if a gate is too small (i.e. smaller than required by the specific design characteristics) it may result in punchthrough, which ultimately causes device failure.

Linewidth variation can be caused by many sources. One source, for example, is the optical proximity effect. The optical proximity effect causes systematic (i.e., not random) linewidth differences between "isolated" features and "nested" features. The term "isolated features" is used to describe lines that are not in the presence of (or are not surrounded by) other lines with similar features and are thus "isolated". The term "nested features" is used to describe lines that are in the presence of (or are surrounded by) other lines with similar features and are thus "nested" or "grouped". When isolated and nested features are patterned on the wafer using commercially available stepping or scanning microlithographic equipment, linewidth variance occurs even though the size of the isolated and nested features on the reticle are the same. There are several methods to reduce the optical proximity effect and improve linewidth control.

One method to improve linewidth control is to select a lithographic process that does not exhibit significant optical proximity effects, such as negative tone patterning. In negative tone patterning the portions of the resist exposed to light become insoluble. These insoluble portions remain behind and act as an etch mask to protect the underlying layer which will form the lines or gates being patterned. Although not well understood, it is a known empirical fact to those skilled in the art, that negative tone patterning exhibits a much smaller degree of optical proximity effects than positive tone patterning. The pattern media, i.e., "dark" field reticles and negative resist, used in negative tone patterning exhibit a much smaller degree of optical proximity effects than the more widely used pattern media, "clear" field reticle and positive resists, of positive tone patterning.

Although negative tone patterning is advantageous due to its lack of optical proximity effects, negative tone patterning also has many disadvantages that have made positive tone patterning more desirable for the last several generations of microphotolithography, for example, generations with device features below 1.50 microns. One such disadvantage is that negative resists tend to exhibit a mechanism known as swelling. That is, negative resists increase in volume, or "swell", as a result of penetration of the resist material by the developer solution. Such swelling causes the feature size of the pattern created in the resist to be altered. As an example, for design features smaller than 3 $\mu$m, the change in feature size is unacceptably large compared to the specified dimensions. Positive resists do not exhibit swelling, due to a different dissolution mechanism during development of the resist, and are therefore desirable for design features smaller than 3 $\mu$m.

Scumming effects are another disadvantage of negative resists. Scumming effects are caused when radiation, scattered off the projection optics, crosslinks a thin layer in the top surface of a negative resist and the thin layer becomes punctured and slides down between the features. As little as 1% scattered light has been observed to produce this unwanted mechanism in negative tone patterning. In positive tone patterning, such scattered light only results in a slight reduction of resist thickness, and no scumming effect is produced. As a result, of swelling and scumming, there are no commercially available high performance negative tone resists for microlithographic patterning of the gate layers for the more recent generations of semiconductor devices. More recent generations of gate layers have dimensions, for example, below 0.8 $\mu$m, and require exposure tools with an exposure wavelength of, for example, approximately 365 nm.

Another way to reduce linewidth differences caused by optical proximity effects is to increase the value of the exposure tool partial coherence ($\sigma$) employed in positive tone patterning. Partial coherence ($\sigma$) of the lithographic equipment is defined as the ratio of the illuminator numerical aperture to the numerical aperture of the projection optics. There is a complex relationship between the partial coherence of the exposure tool and the ability of the exposure tool to pattern and control the linewidth of minimal features of the different kinds of device layers over varying process conditions.

The partial coherence value of commercial microlithographic patterning equipment is customarily defined by the tool manufacturer. As requirements for tighter linewidth tolerance increase, the value of the partial coherence of the microlithographic exposure tool has steadily shifted toward the higher values. For example, exposure tools with partial coherence values above 0.65 have become available on the market. Such a shift to exposure tools with higher partial coherence values is the likely result of manufacturers willingness to sacrifice "ultimate" patterning capabilities and some degree of the process latitude for the reduced proximity effects brought by systems with higher partial coherence values.

Unfortunately, an increase in a system's partial coherence value may result in the creation of new sources of linewidth variations. Although the higher partial coherence value of the exposure tool improves linewidth control via reduction of the proximity effect, higher partial coherence values give rise to other sources of linewidth variation, such as across-the-field linewidth variations.

As an example, 400 nm lines patterned in the i9C Nikon Stepper (available from Nikon Precision Incorporated, Belmont, Calif.) with partial coherence value equal to 0.68 exhibit systemic across the field linewidth variance on the order of 60 nm. Only 20 nm of this across-the-field linewidth variance can be accounted for through known and attributable causes such as, mask errors, illumination nonuniformity, resist processing nonuniformity, as well as existing system residual aberrations and flare. This means that the largest portion (40 nm) of across-the-field linewidth variation is induced by the changing partial coherence across the stepper field. Since it is customary in microlithography to incorporate a feature linewidth control (tolerance) range of approximately +/−10% of the feature linewidth, the tolerance range for a 400 nm wide gate is approximately +/−40 nm. Therefore, the presence of the 40 nm source of linewidth variance that was induced by the exposure tool alone, in this example, is clearly excessive with regard to a manufacturer's ability to stay within customary linewidth tolerance ranges.

Thus, what is needed is a method and system, useful with either positive or negative tone patterning, that minimizes the range of linewidth variations in microlithographic patterning, and a method and system for mapping the coherence conditions across a stepper field.

SUMMARY OF THE INVENTION

The present invention describes a method and system for reducing varying coherence conditions across the field of an exposure tool used in microlithographic patterning without decreasing the throughput of the exposure tool.

The present invention describes a method and system to reduce the effective light source of a stepper field exposure tool in order to decrease the variance of coherence conditions across a stepper field. A preferred embodiment of the present invention utilizes a specially shaped intensity randomizer or a zoom lens in combination with the light source and other customary elements of the illumination system of an exposure tool in order to reduce the size of the effective light source without the loss of the system's optical efficiency.

The present invention also describes a method and system for mapping the change in coherence values across a stepper field. A preferred embodiment of the present invention utilizes proximity structures to measure the varying coherence conditions at different locations in the stepper field.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 6 illustrates a coherence map.

DETAILED DESCRIPTION

An Improved Photolithography Method Using Coherence Distance Control is disclosed. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a method and system that corrects for systematic across-the-field linewidth variations that are induced by an exposure tool design "imperfection." This design imperfection is the non-uniformity or change in coherence distance across the field of an exposure tool, especially an exposure tool with relatively high partial coherence values, for example $\sigma > 0.55$. The change in coherence distance across the field of the exposure tool explains a large portion of the systematic linewidth variance previously unaccounted for in the prior art.

The non-uniformity in coherence distance of an exposure tool is believed to be caused by the excessively large size of the extended area effective light source or, in other words, the excessively large numerical aperture (NA) of the exposure tool illuminator needed to provide large partial coherence values, for example $\sigma \geq 0.60$ which is required by the more recent generations of microlithography exposure tools. Such exposure tools require projection optics with NA=0.55 or larger.

Figure 1:
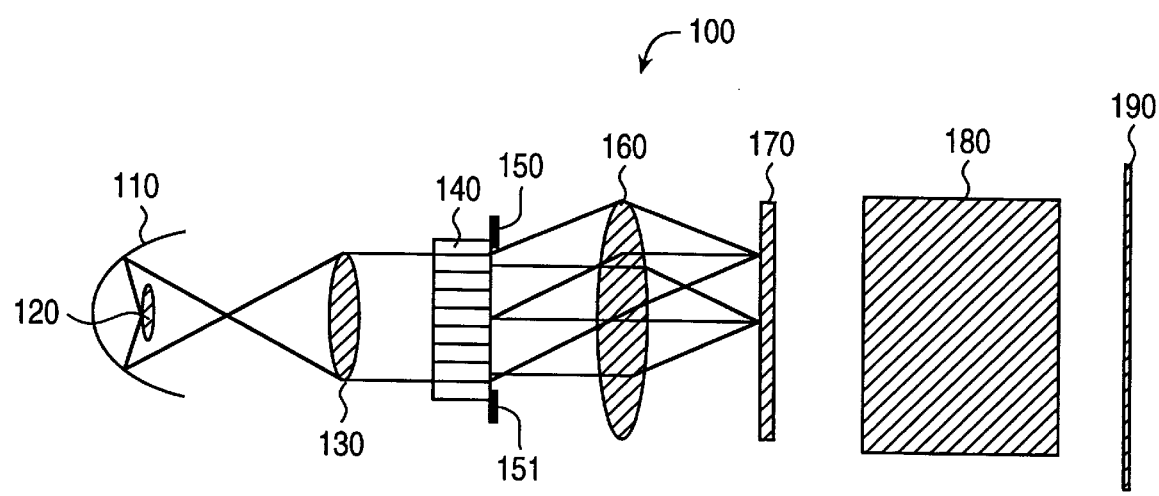
FIG. 1 illustrates a standard illuminator arrangement.

FIG. 1 illustrates a standard illuminator arrangement 100. Radiation concentrator 110, such as an elliptical mirror, reflects energy emitted by radiation source 120 into the entrance pupil of the illuminator, i.e. input lens 130. The illuminator of the exposure tool may employ intensity randomizer 140, which randomizes the intensity of the radiation in the illuminator. Intensity randomizer 140, for example a fly-eye lens, is used in the microlithography exposure tool illuminator in order to insure light intensity uniformity in the projection lens entrance. The exposure tool illuminator may also employ a partial coherence aperture 150, which reduces the undesirable impact of the peripheral regions of the intensity randomizer on the uniformity of the illumination.

The physical size of randomizer 140 or the size of the opening in the partial coherence aperture 150 define the area (size) of the effective light source of the projection system that is used to form the image of reticle 170 on wafer 190. Condenser lens 160 focuses the effective light source onto the entrance pupil of projection lens 180. Projection lens 180 projects the pattern contained in reticle 170 onto the photoresist layer of wafer 190. It is the condition of the spatial coherence across the final image field of the projection lens 180 that can result in large across field linewidth nonuniformity.

Spatial coherence is concerned with the determination of how far away from a given point A, at a given instant, we can go and still make a correct estimate of the phase of the plane wave. Similar to the way that temporal incoherence is related to uncertainty in the frequency ($\omega$) of the wave and thus the uncertainty in the magnitude of the wave-vector, $|k|$, spatial incoherence is related to uncertainty in the direction of the wave vector, k. Uncertainty in the direction of k, the wave vector, arises when the source of the light is not a point source but is an extended source.

The largest distance between point A and the point where the phase of the plane wave can be predicted in a given instant is called coherence distance. The coherence distance is inversely related to the size of the extended source. Thus, the coherence distance of effective light source 150 decreases as the size of effective light source increases.

Extending the size of effective light source 150 into regions where the partial coherence values are larger than 0.6, leads to the introduction of significant non-uniformities in the values of the partial coherence across the field (or image plane) of system 100. Reducing the partial coherence value to 0.6 or less negates a substantial portion of the across the field linewidth variations induced by the excessive size of the effective light source.

Figure 2:
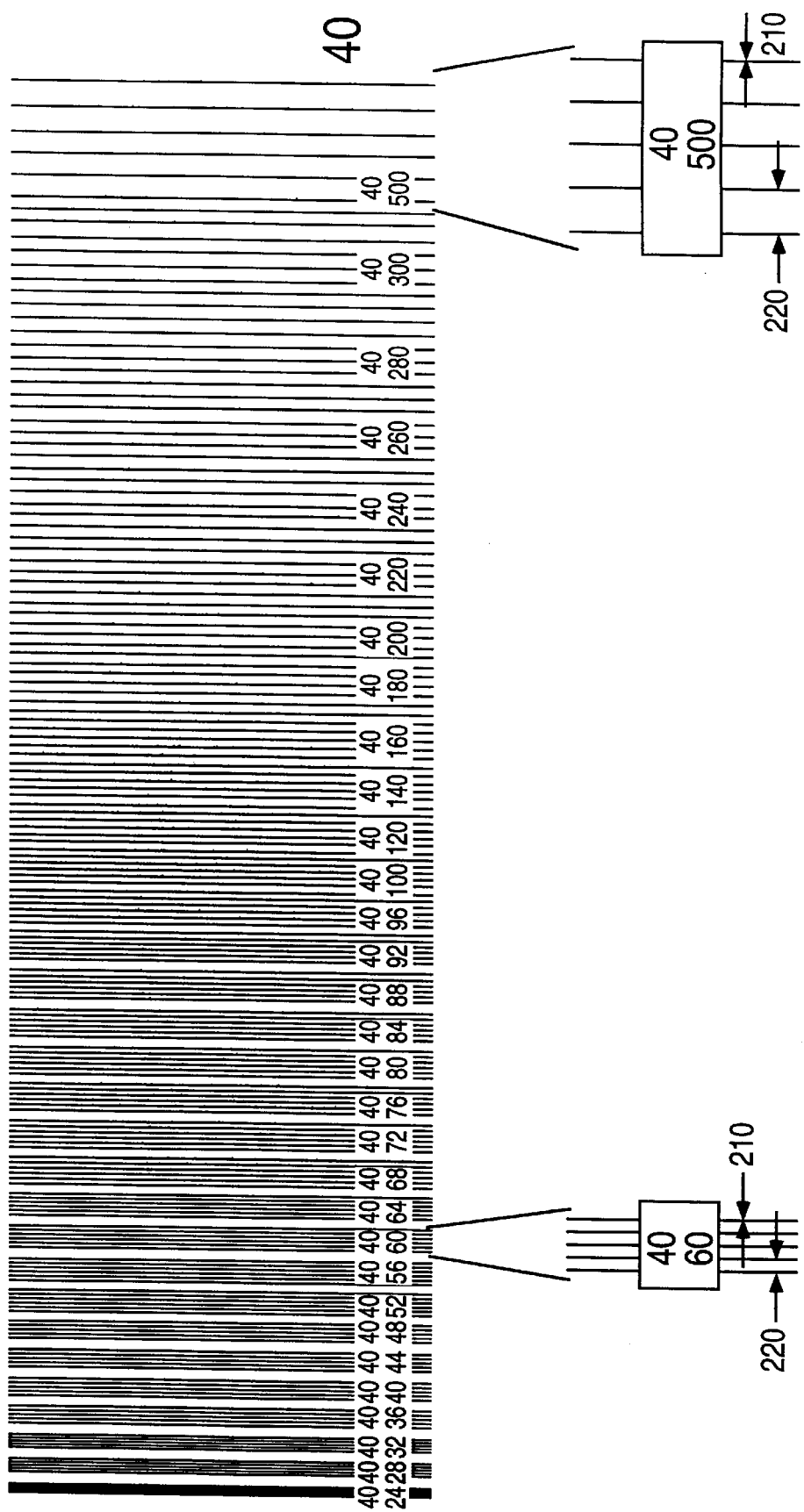
FIG. 2 illustrates a proximity structure of one currently preferred embodiment.

Mapping the changes in coherence values across the image plane of an exposure tool (coherence mapping) is a process which enables a design manufacturer to quickly determine if a particular exposure tool has the ability to meet its specific design requirements. Coherence mapping of a particular exposure tool can be accomplished using proximity sensitive structures (proximity structures). The proximity structures in one currently preferred embodiment have constant line structures with variable pitch. FIG. 2 illustrates a 400 nm proximity structure of one currently preferred embodiment. Linewidth 210, (i.e. the width of a line on the proximity structure), remains constant at 400 nm while the pitch 220, (i.e. the sum of the width of the line and the space between that line and the next line of the proximity structure), increases from 640 nm to 5000 nm. The proximity structures are placed at various locations (i.e., the locations at which it is desired to determine the partial coherence value) on a reticle or "test field".

Figure 3:
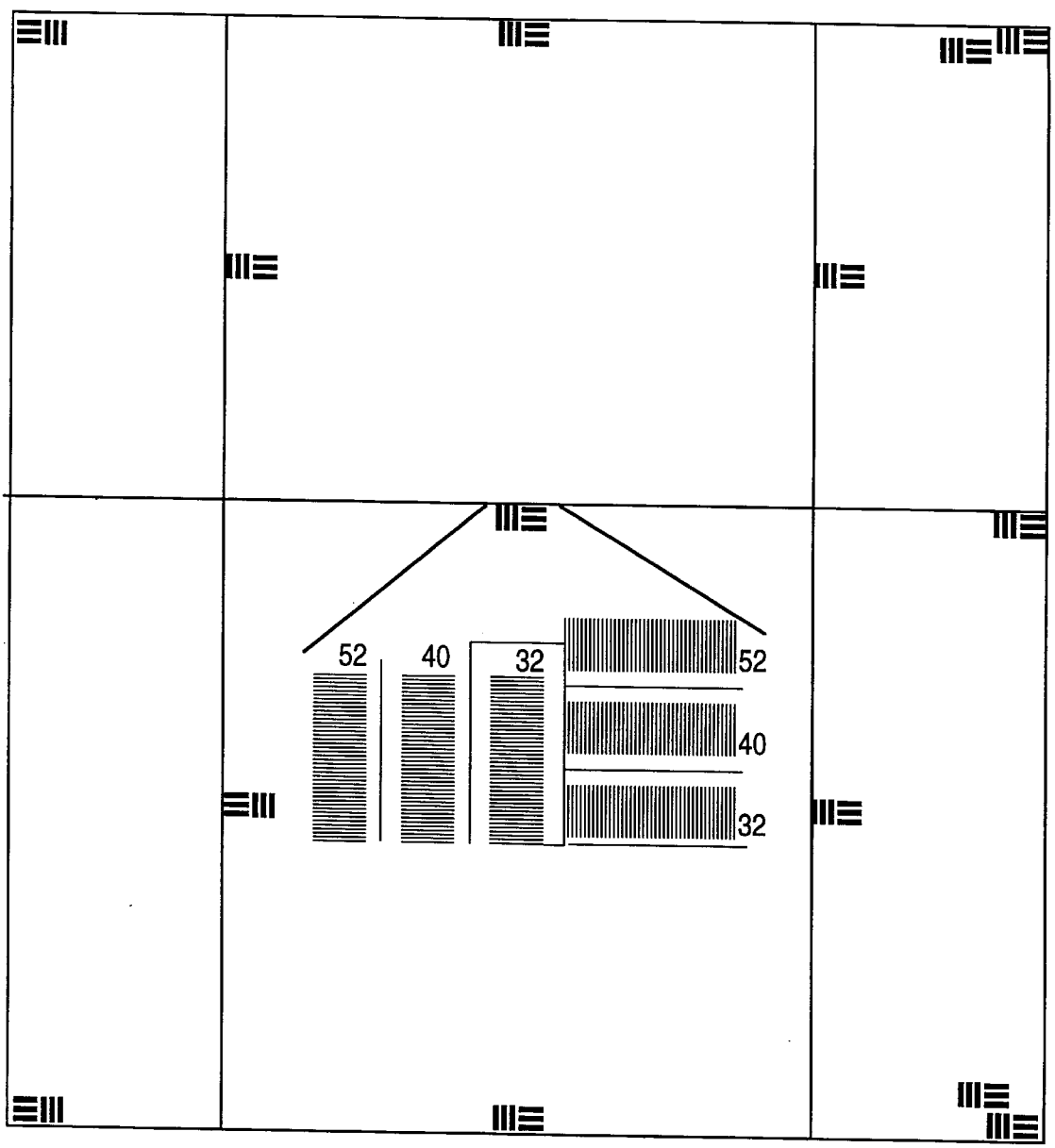
FIG. 3 illustrates the placement of proximity structures within a test field.

In one currently preferred embodiment three base types of proximity structures, such as 260 nm, 400 nm, 520 nm structures, are placed both vertically and horizontally at various positions on the test field as illustrated in FIG. 3. It should be noted that in this embodiment "horizontal" and "vertical" proximity structures are used due to the fact that some manufacturers of lithographic equipment use non-circular partial coherence apertures, which give different coherence values for the "horizontal" and "vertical" orientations of the image plane of the exposure tool. However, it should also be noted that if the exposure tool has a circular aperture, the values for the horizontal and vertical proximity structures should be the same, thus obviating the need to use both horizontal and vertical proximity structures.

Once the proximity structures are placed in the desired locations, the test field is then exposed to radiation. In a currently preferred embodiment the test field is exposed on the exposure tool with an energy corresponding to a 0.0 print bias for a fully nested (i.e. line/space ratio=1:1) base structure feature in the resist on silicon. It will be obvious, however, to one with ordinary skill in the art that other values for the print bias may be chosen as a reference point with which to normalize all the exposures. Next, linewidth information is collected as a function of pitch, orientation, and location in the field. It will be obvious to one with ordinary skill in the art that the linewidth information can be collected using a low voltage scanning electron microscope (SEM), for example, Hitachi SEM Model 6780. This information is used to determine the partial coherence value at each location of a proximity structure in the test field.

The partial coherence value at each location is calculated from the fit of the simulated linewidth, which is a function of the space between the lines (i.e., linewidth=f(space), to the experimental data. For an exposure tool with a given exposure wavelength ($\lambda$), and the projection optics numerical aperture (NA), the shape of the critical dimension curve is defined by the local value of the partial coherence over the area tested by the proximity structure. In other words, the critical dimension (CD) is a function of the pitch of the proximity structure (i.e., CD=f(Pitch)). Fitting the simulated curve to the experimentally obtained curve and using the simulated local value of partial coherence as the fitting parameter allows the extraction of the experimental local value of partial coherence.

Figure 4:
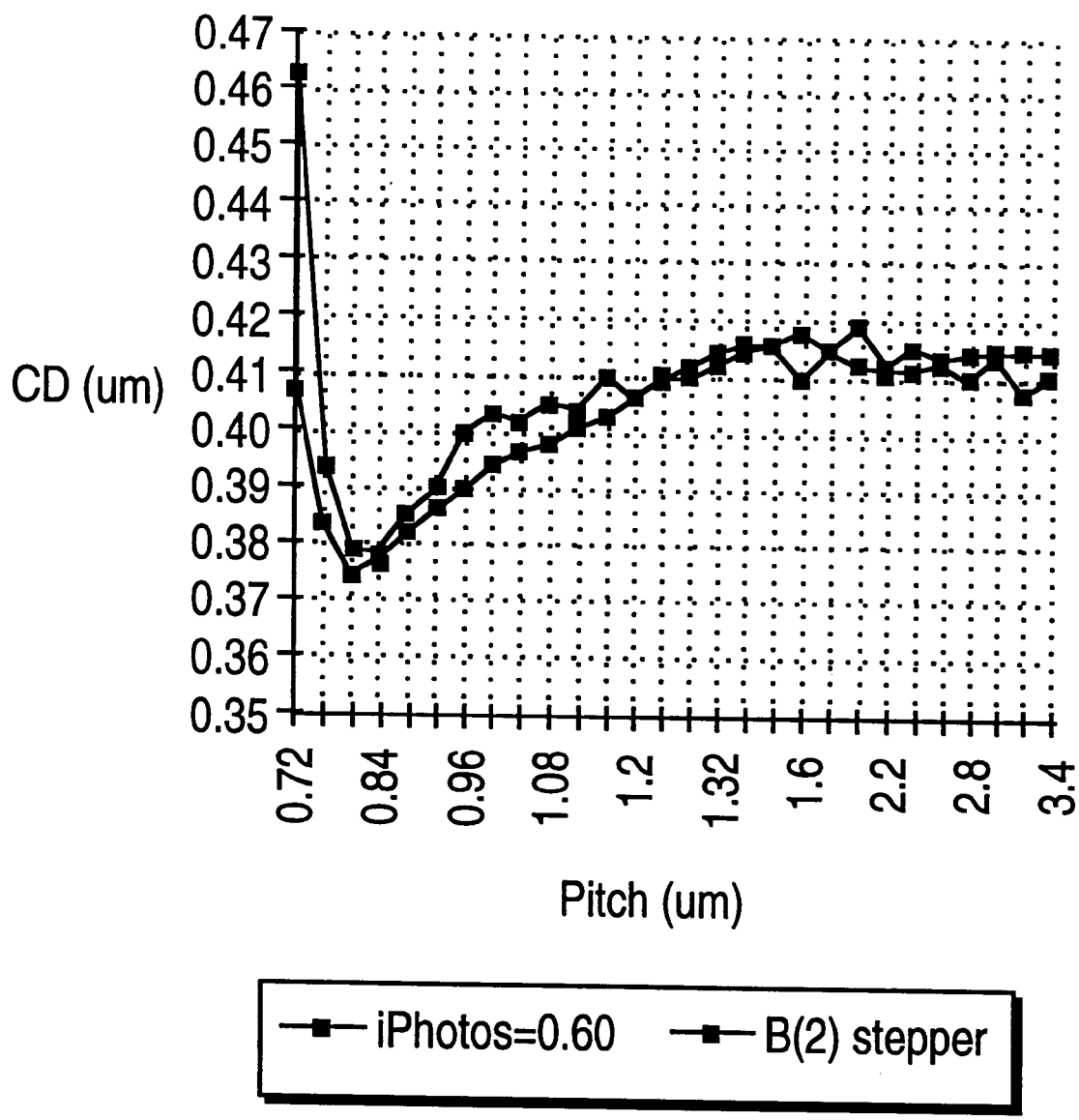
FIG. 4 illustrates the fit of the simulated data to experimental data for determining partial coherence values.
Figure 5:
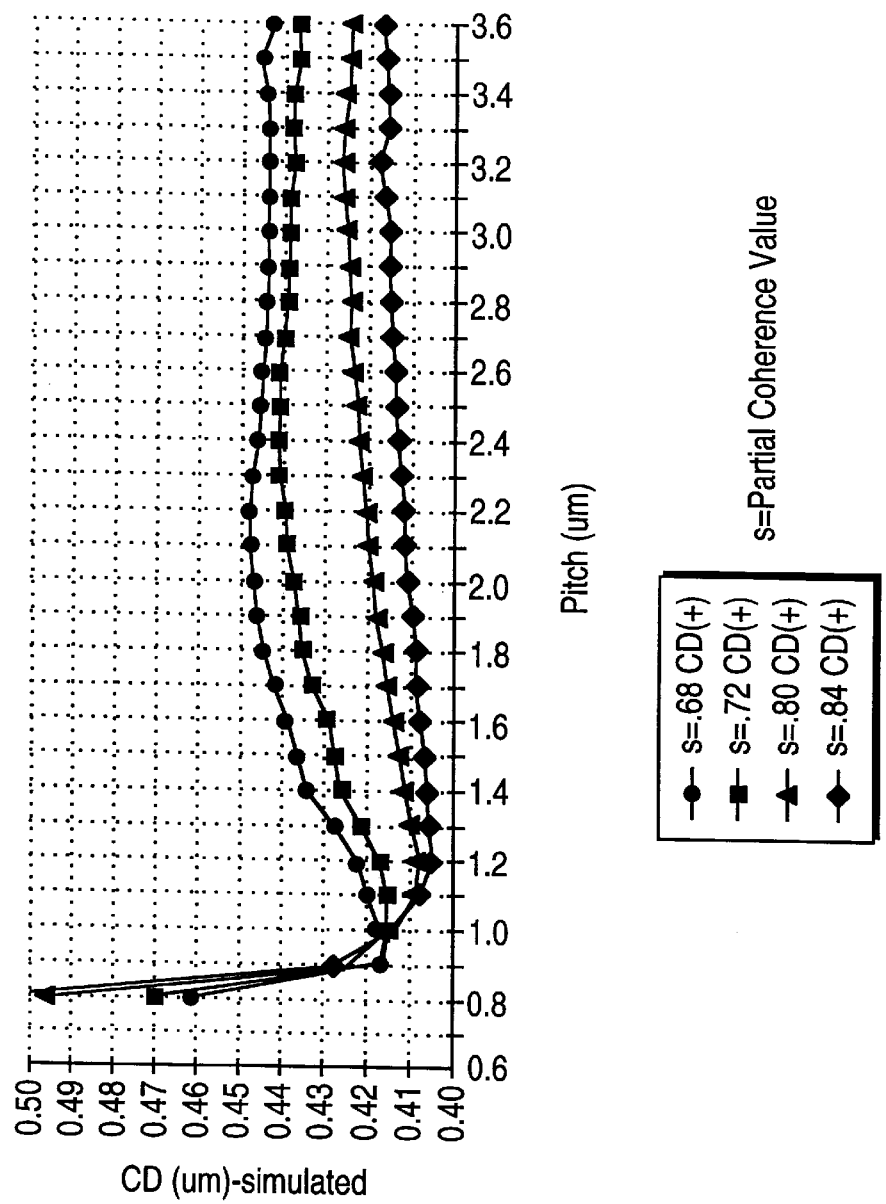
FIG. 5 illustrates a predicted change in a line's critical dimension, CD=f(Pitch), for various values of partial coherence.

FIG. 4 illustrates the fit of the simulated data to the experimental data obtained on the Nikon NSR i9C Stepper (referred to in the prior art section). The IPHOTO II simulator of FIG. 4 is used to demonstrate the data fit and to enable the extraction of the value of the partial coherence from the experimental data for the best fit. That is, the simulated data (IPHOTO II) is fitted to the experimental data (B(2) Stepper) to determine the experimental value of partial coherence. FIG. 5 illustrates a predicted change in the critical dimension as a function of pitch, (i.e., CD=f(Pitch)), for various values of partial coherence (s=$\sigma$). It should be noted that there are several commercially available Lithography simulators which can be used to perform the needed fit and the use of these simulators will be obvious to one with ordinary skill in the art.

Once the partial coherence value is determined for each location, then a "map" of coherence values (coherence map) can be made. FIG. 6 illustrates an example of a coherence map. Field 600 represents a standard exposure tool image field probed by the coherence mapping reticle with calculated values for the local partial coherence. It should be noted that FIG. 6 illustrates the partial coherence values for both the vertical (upper value) and horizontal (lower value) orientations in the field associated with the probed locations.

The large observed variance of the partial coherence across the tested field 600 illustrates the partial coherence non-uniformity problem induced by the large effective source. According to the specifications of the exposure tool for this particular sample field, the partial coherence value should be 0.68. The numbers shown across field 600 represent the measured partial coherence values at each particular location of the reticle. It should be noted that the partial coherence values in FIG. 6 correspond to the locations of the proximity structures in FIG. 3. The upper value at a given location represents the coherence value for the vertically oriented proximity structures and the lower value represents the coherence value for horizontally oriented proximity structures. It can be seen from FIG. 6 that as the coherence values go radially outward from the center of field 600 the partial coherence values increase. It can also be seen that vertically oriented proximity structures exhibit a much greater discrepancy than horizontally oriented proximity structures. Since the partial coherence value was previously believed to be a constant across a field (or reticle), the determination that partial coherence is actually a variable has great potential for explaining linewidth variance and other phenomena in photolithography that previously had no explanation.

For example, a coherence map, such as the one shown in FIG. 6, can be used to determine the source of linewidth variance in an existing production line or to determine if a particular exposure tool has the ability to meet the design requirements for a specific technology.

Coherence maps are also beneficial in determining possible solutions to the varying coherence conditions across the field of an exposure tool and consequently in improving linewidth control in lithographic patterning. In order to achieve improved linewidth variance control across a semiconductor wafer it is important to maintain the same partial coherence value with the same coherence distance across the image plane. Reduction of the area or size of the effective light source and/or reduction of the illuminator numerical aperture are two ways to reduce patterned feature linewidth variance and allow the control of the coherence distance of an exposure tool.

The method or system used depends upon the feasibility and the tolerances required in a specific technology. Although reducing the size of the effective light source is necessary for better control of the coherence conditions on the system, it may result in the reduced light flux through the system. In other words, it may result in the decrease of the system throughput. Such a decrease has highly adverse economical impacts that should be avoided, if possible.

Figure 7:
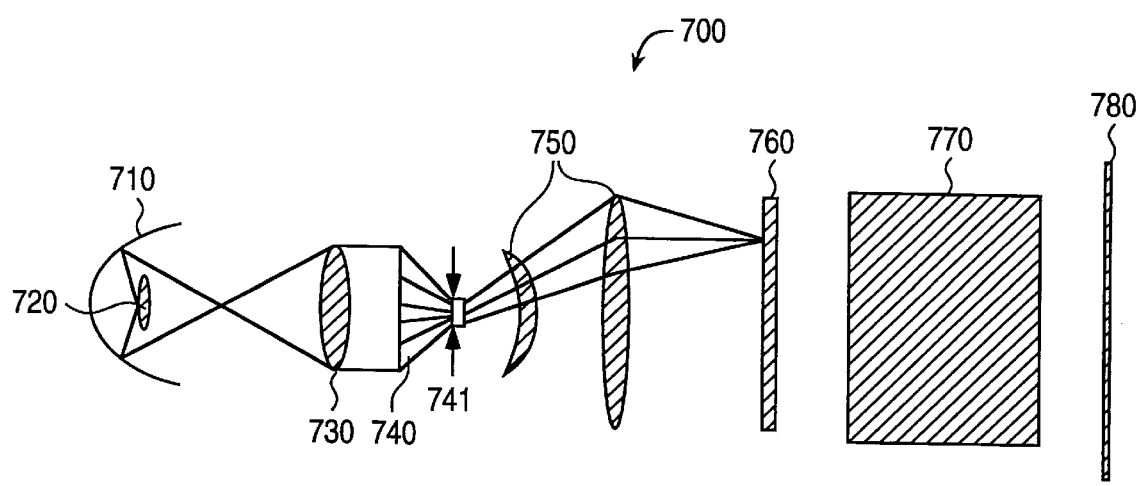
FIG. 7 illustrates one preferred embodiment of an illuminator containing a conical shaped intensity randomizer.

Two types of systems to reduce the size of the effective light source without reducing the light flux through the projection system are conical shaped intensity randomizer systems and zoom lens systems. A preferred embodiment of a conical shaped intensity randomizer system is illustrated in FIG. 7. Elliptical mirror 710 reflects radiation from light source 720 into illuminator input lens 730 which directs the radiation into conically shaped intensity randomizer 740. Conical shaped intensity randomizer is, in a preferred embodiment, a lens made up of many optical tunnels (or fibers) coupled together in a formation much like the eye of an insect, such as a fly-eye, but the exiting end of the lens tapers off. The radiation from conical intensity randomizer 740 has the same light flux at the lens exit as at its entrance but the area on the exit side is smaller than on the lens entrance side. Thus, conical shaped intensity randomizer 740 determines the effective light source size 741. The size of effective light source 741 is reduced compared to the size of effective light source 151 in FIG. 1. The size of effective light source 741 is reduced to a value that provides for uniform distribution of partial coherence in the image plane of the exposure system. Condenser lenses 750 focus the effective light source onto reticle 760 which contains the image of features to be patterned on wafer 780. Projection lens 770 projects reticle pattern 760 onto the photoresist layer of wafer 780.

Figure 8:
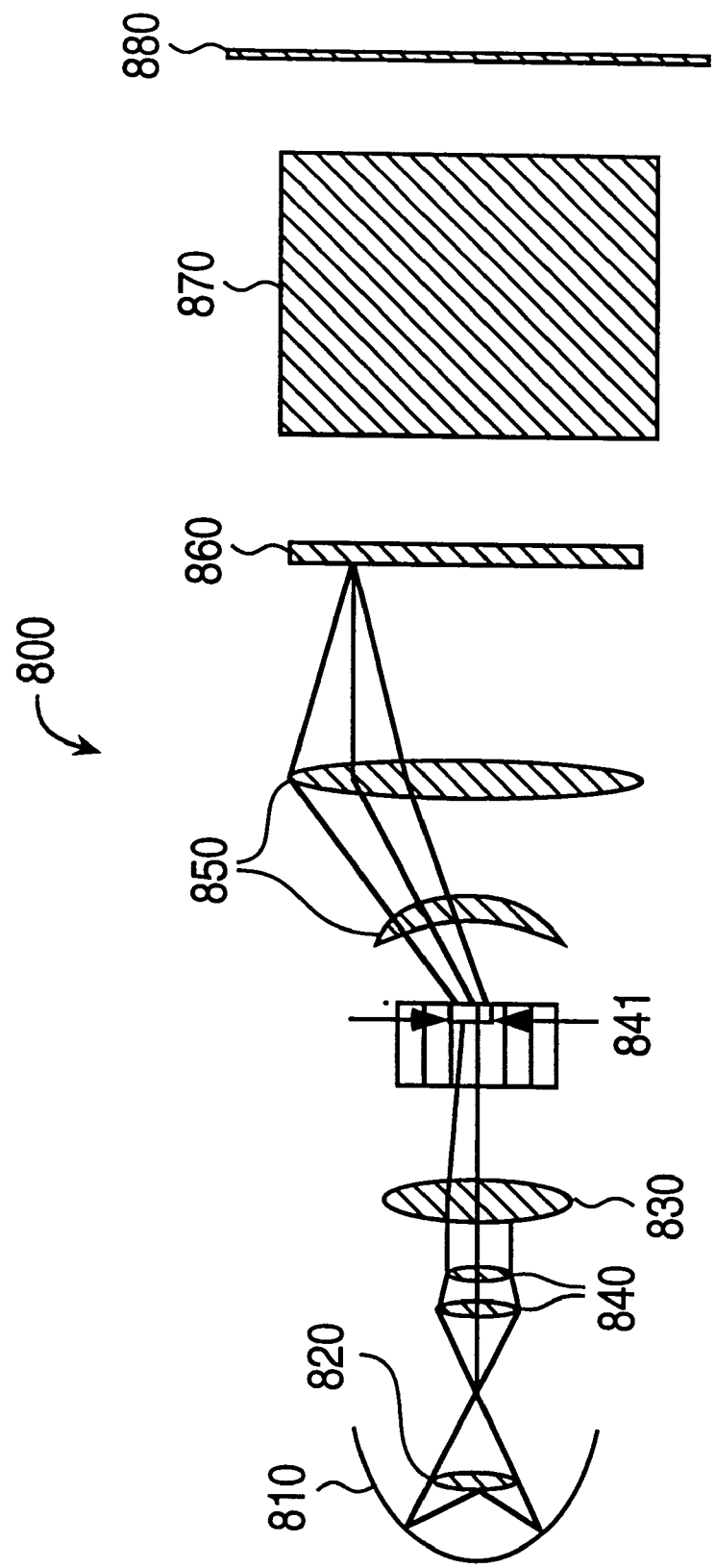
FIG. 8 illustrates one preferred embodiment of an illuminator containing a zoom lens.

A preferred embodiment of an illuminator containing a zoom lens system is illustrated in FIG. 8. Reflector (Elliptical mirror) 810 reflects radiation from light source 820 into zoom lens group 840 (zoom lens). Zoom lens 840 in conjunction with the input lens 830 concentrates the radiation from the light source 820 onto the exit face of a standard intensity randomizer 835, thus allowing for a controlled change of the effective light source size when needed. When the light exits intensity randomizer 835 the effective light source size 841 is reduced compared to the size of effective light source 151 in FIG. 1 without any loss in the light flux. Condenser lenses 850 focus the effective light source 841 onto reticle 860 which contains the features to be patterned on wafer 880. Projection lens 870 projects reticle pattern 860 onto the photoresist layer of wafer 880.

It should be noted that, in the two systems described above, additional condenser optics may be required to accommodate the smaller sized effective light source. It should also be noted that, in the two systems described above, the total energy flux exiting the illuminator is greater than what it would be in the system 100 which reduces the effective size of the light source by reducing/limiting the size of partial coherence aperture 150. Additionally, it should be noted that other systems and methods which reduce the effective source size of an exposure tool, in light of the above description, will be obvious to one with ordinary skill in the art.

Another method to reduce across-the-field linewidth variations is to reduce the numerical aperture (NA) of the illuminator. One preferred embodiment of the present invention places a "stop" in front of or behind the condenser optics. Essentially, reducing the NA of the illuminator reduces the partial coherence of the exposure tool. This in turn increases the coherence distance of the exposure light thus, giving desirable control of the illumination coherence distance. As a result, across-the-field linewidth variations are reduced significantly.

Thus, an Improved Photolithography Method Using Coherence Distance Control has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A system for lithographic patterning comprising:
   a radiation source;
   an input lens, wherein said input lens gathers radiation from said radiation source;
   a conical fly-eye lens, wherein said conical fly-eye lens reduces an effective size of said radiation source;
   a condenser lens system, wherein said condenser lens system includes at least two lenses and wherein said condenser lens system gathers radiation from said conical fly-eye lens and allows said radiation to illuminate a reticle, wherein said reticle contains a pattern to be patterned onto a wafer; and
   a projection lens for projecting said pattern on said reticle onto said wafer.

2. The system as described in claim 1 wherein said radiation source is a finite light source.

3. A system for lithographic patterning comprising:
   a radiation source providing radiation;
   a zoom lens, wherein said zoom lens reduces an effective size of said radiation source;
   an input lens, wherein said zoom lens in conjunction with said input lens concentrates said radiation from said radiation source onto a fly-eye lens;
   a fly-eye lens;
   a condenser lens system, wherein said condenser lens system includes at least two lenses and wherein said condenser lens system gathers radiation from said fly-eye lens and allows said radiation to illuminate a reticle, wherein said reticle contains a pattern to be patterned onto a wafer; and
   a projection lens for projecting said pattern on said reticle onto said wafer.

4. The system as described in claim 3 wherein said radiation source is a finite light source.

* * * * *